United States Patent [19]
Greenstein et al.

[11] Patent Number: 5,529,504
[45] Date of Patent: Jun. 25, 1996

[54] ELECTRICALLY ANISOTROPIC ELASTOMERIC STRUCTURE WITH MECHANICAL COMPLIANCE AND SCRUB

[75] Inventors: Michael Greenstein, Los Altos, Calif.; Masakuzu Sugimoto; Hiroshi Yada, both of Mie, Japan

[73] Assignee: Hewlett-Packard Company, Palo Alto, Calif.

[21] Appl. No.: 424,776

[22] Filed: Apr. 18, 1995

[51] Int. Cl.$^6$ .............................. H05K 1/14; H05K 3/10; H01R 9/09
[52] U.S. Cl. .................. 439/91; 29/831; 29/874; 29/879; 439/67
[58] Field of Search .................... 439/66, 67, 91; 29/830, 831, 874, 879

[56] References Cited

U.S. PATENT DOCUMENTS

| | | | |
|---|---|---|---|
| 4,249,302 | 2/1981 | Crepeau | 29/830 |
| 4,553,192 | 11/1985 | Babuka et al. | 439/66 |
| 4,915,983 | 4/1990 | Lake et al. | 29/831 |
| 5,136,359 | 8/1992 | Takayama et al. | 357/65 |
| 5,147,210 | 9/1992 | Patterson et al. | 439/91 |
| 5,187,020 | 2/1993 | Kwon et al. | 439/91 |
| 5,188,702 | 2/1993 | Takayama et al. | 156/630 |
| 5,197,892 | 3/1993 | Yoshizawa et al. | 439/91 |
| 5,207,585 | 5/1993 | Byrnes et al. | 439/66 |
| 5,374,196 | 12/1994 | Horine | 439/91 |
| 5,395,253 | 3/1995 | Crumly | 439/67 |
| 5,417,577 | 5/1995 | Holliday et al. | 439/91 |
| 5,434,452 | 7/1995 | Higgins, III | 439/91 |

OTHER PUBLICATIONS

Yamamoto et al., "Evaluation of New Micro-connection System Using Microbumps," *1993 International Symposium on Microelectronics*, SPIE vol. 2105, pp. 370–378, (Nov. 1993).

*Primary Examiner*—Gary E. Elkins

[57] ABSTRACT

A microconnection device and a method of forming such a device include providing an array of electrically interconnected conductors within through holes of an insulative flexible film. Preferably, each conductor has a microbump. Since the conductors are interconnected, the microbumps define a cluster for contact with a single contact, such as an input/output pad of a semiconductor device. In the preferred embodiment, the flexible film includes a cavity at the central region of the cluster, thereby enhancing the flexibility of the film. By applying a load force within the central region of the cluster, the flexible film is caused to bend in a manner to achieve load compliance and a lateral scrub for removing contaminants, oxides and the like at the interface of the microbumps and the contact. A top bump that is misaligned with the microbumps may be formed to ensure proper localization of the load force within the central region. Preferably, the flexible film includes an array of microconnection devices.

19 Claims, 7 Drawing Sheets

ELECTRICALLY ANISOTROPIC ELASTOMERIC STRUCTURE WITH MECHANICAL COMPLIANCE AND SCRUB

TECHNICAL FIELD

The invention relates generally to interconnection devices and methods and more particularly to devices and methods for forming solder-free and demountable microconnections between two circuits.

BACKGROUND ART

There are a number of applications for demountable electrical connections between two circuits. At least one of the circuits may be a connector or an integrated circuit die. Often, contacts are closely spaced, so that any demountable connection device must have a high density of electrically isolated conductors. Specific applications for these connection devices include conducting signals to and from an integrated circuit die to test equipment for determining the electrical properties of the die, and providing Z-axis electrical conductivity for operating a circuit. A Z-axis microconnection device is sometimes referred to as an "anisotropic conductive elastomer."

One known method for providing small scale, high density interconnections is to embed plated wires within a silicone rubber sheet. The wires provide electrical conductivity in a single direction, i.e. provide Z-axis conductivity. A benefit to this type of conductor is that the silicone rubber provides a degree of compliance. Load compliance is important, since input/output pads of a die may vary in height and since the passivation layer between adjacent pads is susceptible to damage upon the application of force by the microconnection device. A difficulty with this device is that techniques for embedding wires in the sheet impose a limitation on the center-to-center spacing of connections. The smallest linear pitch of the wires is currently 100 µm.

Figure 1:
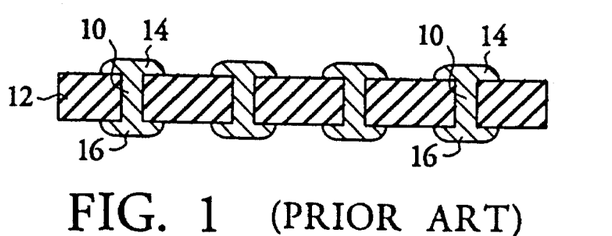
FIG. 1 is a side sectional view of a prior art connection device for providing anisotropic conductivity.

FIG. 1 shows a microconnection device that utilizes plated through holes 10, rather than wires. The plated through holes are metallic members within a porous insulating sheet 12, such as a polyimide sheet. U.S. Pat. Nos. 5,188,702 and 5,136,359 to Takayama et al. describe anisotropic conductive films of the type shown in FIG. 1. Axially aligned bumps 14 and 16 are formed on the opposed sides of each plated through hole 10. A load force can be applied to the upper bumps 14 to press the lower bumps 16 into contact with input/output pads of an integrated circuit die or other circuit of interest. Signals may be channeled to and from the upper bumps 14 by traces formed on the insulating sheet 12 or by conductive members that are pressed against the upper bumps during the application of the load force. The pitch of the bumps 16 may be significantly less than that of the pitch of wires embedded in a sheet. The bumps 16 may be formed to have diameters of 10 µm and may have a pitch of 15 µm. While this provides a greater density of connections than is available with devices having embedded wires, the close spacing limits the load compliance of the device.

As previously noted, one specific application for microconnection devices is testing integrated circuit die to determine electrical properties of the die. Die-level testing is becoming increasingly important as the use of multichip modules (MCM) increases. The process of testing integrated die prior to mounting the die onto a printed circuit assembly or an MCM is known in the industry as "known good die" (KGD) testing. The yields of the various types of die within a particular MCM strongly affects the MCM yield. Die replacement for MCMs is typically cost ineffective. Ideally, die-level testing includes DC tests, functional tests and AC tests, and is carried out by the die suppliers.

KGD testing may be performed using mechanical probes, such as needle-like probes. U.S. Pat. No. 5,207,585 to Byrnes et al. describes a probe for making temporary or permanent interconnections to pads on a semiconductor device. Metallic bumps are pressed against the pads of the semiconductor device to electrically join the device to external circuitry. An article entitled "Evaluation of New Micro-connection System Using Microbumps," by Yamamoto et al., 1993 *International Symposium on Microelectronics*, SPIE Vol. 2105, pages 370–378 (1993), also describes the use of microbumps for KGD testing.

Figure 2:
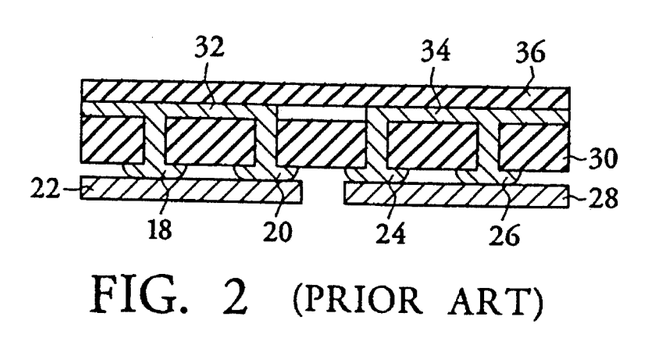
FIG. 2 is a side sectional view of a prior art connection device for die-level testing.

Conventionally there is a one-to-one correspondence of microbumps to contacts of a circuit of interest. However, techniques for forming plated through holes permit a greater density of microbumps than contacts. FIG. 2 illustrates two microbumps 18 and 20 that contact a first pad 22, with microbumps 24 and 26 contacting a second pad 28. At the opposite side of a flexible membrane 30 are traces 32 and 34. The trace 32 electrically connects the two microbumps 18 and 20 that contact the first pad 22. The trace 34 electrically joins the microbumps 24 and 26 that contact the second pad 28. The traces 32 and 34 extend beyond the connection to the bumps in order to permit contact with external circuitry. These traces may be formed on the upper surface of the flexible membrane 30, or on a carrier 36.

While the known prior art microconnection devices for KGD testing and other applications requiring high density anisotropic conductive pads work reasonably well for intended purposes, concerns regarding reliability exist. Firstly, there remains a possibility that an incorrect circuit-test failure will register when, for example, a compression force is weak. While forming the microbumps on a flexible membrane will provide some vertical compliance, the close spacing of the microbumps significantly limits the amount of flexing that can take place between the microbumps. Another concern is that a false indication of failure may occur if either the microbumps or the contacts of the circuit of interest are stained with a nonconductive material, e.g. oil, or have acquired a layer of oxide. For example, an aluminum input/output pad of a semiconductor die may have a thin layer of aluminum oxide that jeopardizes the electrical connection between the microbumps and the pad.

What is needed is a microconnection device and method that provide a high level of uniformity of compression force. What is further needed is such a device and method that reduce the susceptibility of solder-free microconnections to false indications of circuit discontinuity.

SUMMARY OF THE INVENTION

The invention provides an increase in load compliance and a lateral scrub by electrically connecting two or more bumps to form a cluster and applying a load force to the cluster in a manner to translate a portion of the vertical load force into a lateral expansion of the cluster. The lateral expansion of the cluster is one in which each of the microbumps slides along the surface of a contact, such as an input/output pad of a semiconductor circuit, creating a scrub that displaces foreign matter or oxide at the interface of a bump and the contact.

Through holes are formed in an electrically insulative flexible film. Metallic conductors extend through the through holes to permit conduction of signals from a first side to the opposite second side of the flexible film. Raised areas, such as microbumps, are formed at each through hole on the first side of the flexible film. Clusters of conductors and their associated microbumps are electrically interconnected. In the preferred embodiment, the interconnection is achieved by patterning traces on the second side of the flexible film. While a cluster may only have two bumps, preferably each cluster includes at least three microbumps.

A load force for pressing the microbumps into contact with an input/output pad or the like is applied within a central region of a cluster. That is, the means for applying the load force is misaligned with the microbumps. As a result, the load force causes the flexible film to flex within the central region of the cluster. The flexure presses the microbumps radially outwardly from the central region. As the bumps slide along the surface of the pad, the resulting wiping effect increases the likelihood that the desired electrical connection will be made at each of the redundant bumps within the cluster.

In the preferred embodiment, the thickness of the flexible film is reduced at the central region of each cluster. For example, an insulating polymeric film may be etched between the microbumps of the cluster. The thinner central region facilitates flexure of the film within the central region, further increasing the likelihood that the desired electrical connection will be achieved upon application of the load force.

In one embodiment, the load force is applied via a trace that extends to the central region. In another embodiment, the device includes a top bump that is centrally located within the cluster.

In the formation of an integrated circuit die, input/output pads are surrounded by a passivation layer. The load force applied to a connection device must not be sufficient to crack or otherwise damage the passivation layer. Because the invention promotes flexure of the flexible film even when the microbumps are closely spaced, an advantage of the invention is that the device is sufficiently compliant to adjust the level of compression force.

Another advantage of the invention is that a controlled lateral scrub of an undesired oxide layer or other matter is provided in order to remove the oxide layer or other matter that might otherwise prevent the desired electrical connection. The connection device and method may be used for circuit testing at a die-level or may be used for other high density, anisotropic conductive applications.

BEST MODE FOR CARRYING OUT THE INVENTION

Figure 3:
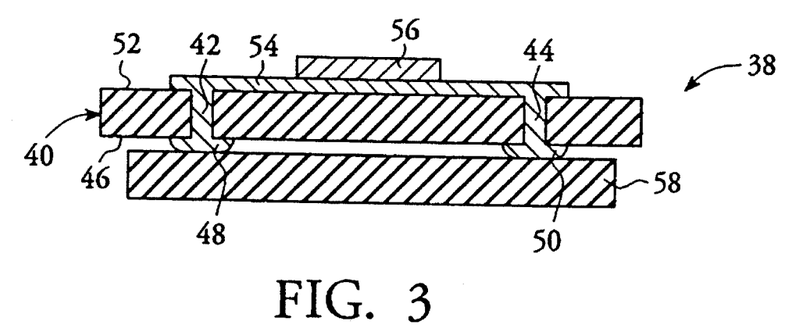
FIG. 3 is a side sectional view of a first embodiment of a microconnection device for anisotropic conductivity in accordance with the invention.

With reference to FIG. 3, a connection device 38, embodied as an anisotropic conductive elastomer, is shown as including a flexible film 40 having a pair of through holes 42 and 44. The flexible film 40 is also referred to as the "elastomer." The film is formed of an electrically insulating material and may be selected from a variety of resins, including polyester resins, epoxy resins, urethane resins, polystyrene resins, polyethylene resins, polyamide resins, polyimide resins, ABS resins, polycarbonate resins, silicone resins and fluorine resins. Of these, a polyamide resin is preferred, because of its desirable aspects with respect to heat resistance, mechanical strength, and processing.

The through holes 42 and 44 are plated through holes having a metallic material. For example, copper may be introduced into the through holes by electrolyte plating.

At a first surface 46 of the flexible film 40 are a pair of microbumps 48 and 50 that are aligned with the plated through holes 42 and 44. A second surface 52 includes a trace 54 that electrically connects the plated through holes. A load member 56 is positioned above the trace 54. The lateral dimension of the load member 56 is less than the distance between the two microbumps 48 and 50. Thus, the load member is within a central region of the electrically connected microbumps.

The trace 54 may be referred to as an electrode. The microbumps 48 and 50 are in contact with an electrically conductive contact 58. The contact may be an input/output pad of a semiconductor device or a conductor of a connector. In the preferred embodiment, the load member 56 is conductive and is either a component of or connected to an external circuit. In this embodiment, signals at the load member 56 are channeled to the contact 58. Alternatively, the trace 54 is joined to the external circuit by an electrical path not shown in FIG. 3.

By means of structure not shown in FIG. 3, the load member 56 is pressed downwardly to apply a load force onto the central region between the two microbumps 48 and 50. Because the applied force is misaligned with the microbumps, the flexible film 40 is induced to flex at its central region. As a result of the flexure, the rounded bumps are induced to rotate and to move radially outwardly from the central region. The interface of the bumps with the contact is therefore subjected to a scrub that acts to remove any foreign matter at the interface. For example, if aluminum oxide is formed on an aluminum contact, the oxide will be removed by the scrub.

In addition to the scrub, localizing the load force to a central region between the microbumps 48 and 50 provides load compliance. Preferably, the load force is sufficient to allow the microbumps to crack any oxide on either or both of the microbumps and the contact 58. However, the load force should be less than that which would jeopardize the structural integrity of the passivation layer that is typically formed between adjacent contacts of a semiconductor device. The load compliance provided by the centralization of the applied load force self-adjusts the level of compression force at the interface of the microbumps and the underlying surface.

Figure 4:
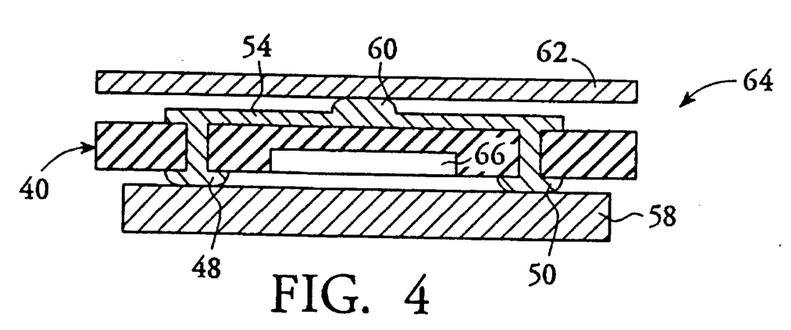
FIG. 4 is a side sectional view of a second embodiment of a microconnection device in accordance with the invention.

In FIG. 4, a top bump 60 is shown as being formed on the upper trace 54 previously described with reference to FIG. 3. The formation of the top bump allows the applied load force to be further localized. Preferably, the lateral dimension of the top bump is minimized, thereby maximizing the moment arm formed from the top bump to the axes of each of the bottom bumps 48 and 50. The top bump is shown as being contacted by a conductive member 62. The conductive member may be a lead of a tape automated bonding (TAB) frame. Alternatively, the conductive member may be a trace on a lower surface of a substrate, such as a ceramic substrate.

The embodiment of FIG. 4 is preferred to that of FIG. 3, since the top bump 60 increases the localization of the load force, thereby enhancing the load compliance of the connection device 64. Enhanced compliance is also achieved by providing a reduced film thickness area 66 within the central region between the bumps 48 and 50. As will be explained more fully below, the central region may be etched to form the cavity 66. The cavity increases the flexibility of the film 40 within the central region.

Figure 5:
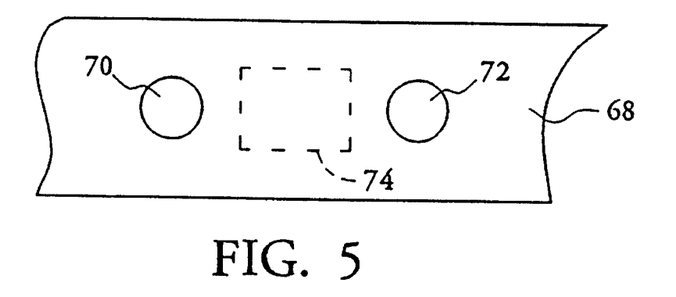
FIGS. 5–7 are top views of flexible films that have been patterned in accordance with the invention, with each of the three views showing a different number of through holes.

Referring now to FIG. 5, prior to formation of electrical paths along and through a flexible film 68, such as a polyimide film, through holes 70 and 72 are formed using known techniques. Acceptable techniques include laser processing, mechanical processing, photolithography using a photosensitive resin, and chemical etching. Laser processing may be used to form closely spaced, small diameter holes that maximize the number of microbumps for connection to a single contact. Also shown in FIG. 5 is a cavity 74 within the central region between the two through holes 70 and 72. The cavity is shown by dashed lines, since it is at the lower side of the flexible film 60, rather than at the top side shown in FIG. 5.

Figure 6:
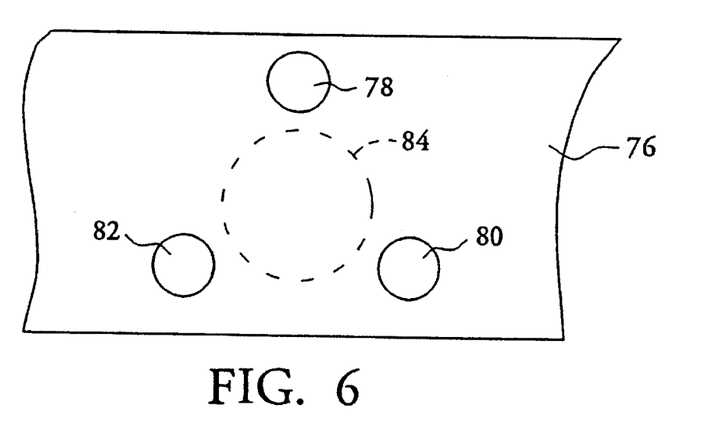

While FIGS. 3 and 4 illustrate embodiments in which two microbumps 48 and 50 are electrically interconnected to form a two-bump cluster, preferably clusters include more than two interconnected bumps that are pressed radially outwardly upon the application of a load force. In FIG. 6, a flexible film 76 includes three through holes 78, 80 and 82 symmetrically positioned about a half-etched central region 84. Upon completion of a connection device, the through holes are plated with material and extend to bumps that are electrically connected to form a cluster. Application of a load force that is localized to the central region of the cluster will cause bumps to rotate and the cluster to expand radially outwardly, providing the desired load compliance and scrub. The partially etched central region 84 is shown as being circular, but this is not critical. For example, the partially etched central region may have a triangular shape. One side of an equilateral triangle may be adjacent to the uppermost through hole 78 and parallel-the opposed edges of the flexible film 76.

Figure 7:
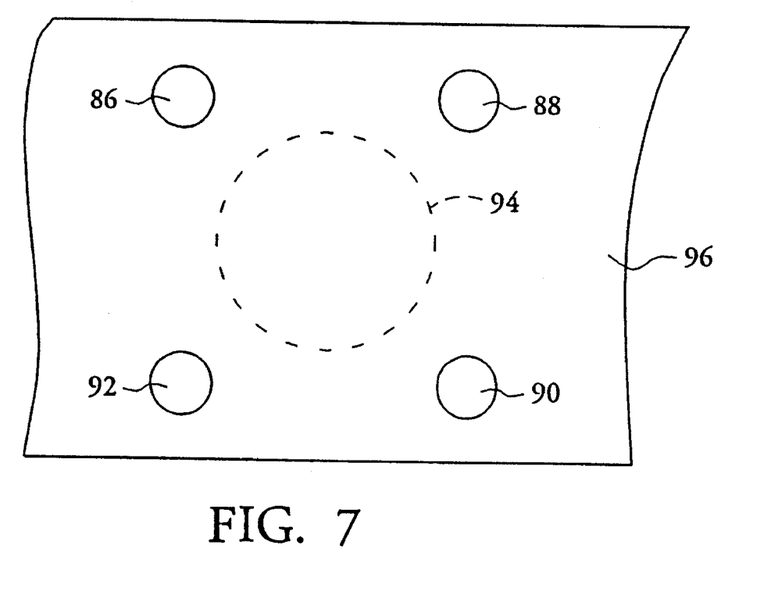

Referring to FIG. 7, four through holes 86, 88, 90 and 92 are shown as being formed symmetrically around a partially etched central region 94. The through holes may be filled with conductive material and connected to bumps on an underside of the flexible film 96 to form a cluster of bumps that expands radially upon the application of a load force at the central region 94. Again, the partially etched central region need not have a circular shape. The removal of material to reduce the thickness of the flexible film 96 may be one in which a diamond shape is formed, with points between each of adjacent through holes 86–92 in the cluster. In the preferred embodiment the shape of the reduced thickness central region is designed such that the application of a load force moves the microbumps equidistantly, but this is not critical.

Figure 8:
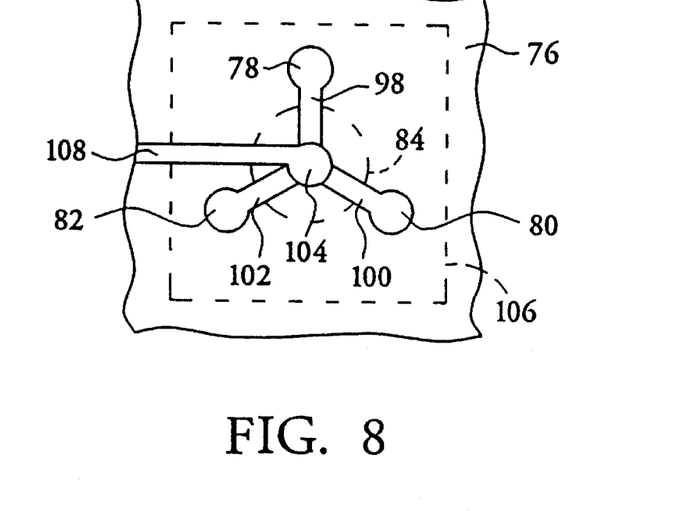
FIGS. 8 and 9 are top views of the flexible films of FIGS. 6 and 7, respectively, following formation of electrical paths among the through holes of the flexible films.

Referring now to FIG. 8, the through holes 78–82 of FIG. 6 have been plated with a conductive material and traces 98, 100 and 102 have been formed along the surface of the flexible film 76 to interconnect the plated through holes. On the same side of the flexible film and coaxial with the partially etched central region 84 is a top bump 104. A load force may be applied to the top bump to press microbumps into contact with an input/output pad 106 of an integrated circuit chip that is positioned below the flexible film. The microbumps apply a wiping action to the surface of the pad 106 when the top bump 104 is pressed downwardly. A signal trace 108 is used to conduct signals to and from the input/output pad 106 via the traces 98–102 and the plated through holes 78–82.

Figure 9:
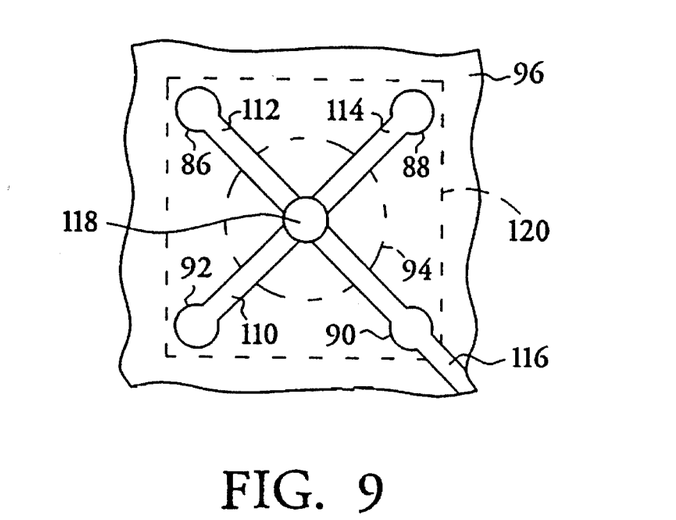

In FIG. 9, the through holes 86–92 of FIG. 7 have been plated and interconnected by traces 110, 112, 114 and 116. A top bump 118 is aligned with the axis of the reduced-thickness central region 94. An input signal may be received along trace 116 and applied to each of the plated through holes. A low-resistance connection is formed with an input/output pad 120 of an integrated circuit chip or the like upon the application of a load force onto the top bump 118.

While FIGS. 8 and 9 have been described as being connections to square input/output pads 106 and 120, this is not critical. For example, the pads may be contacts of a connector. Moreover, the shape of the pad or other type of contact is not an issue.

Each of the embodiments described above provides an equal degree of scrub for each microbump in a cluster. This is the preferred embodiment. However, an asymmetrical design may be utilized if varying degrees of scrub are desired. For example, the cavity formed by reducing the thickness of the flexible film at the central region may be non-concentric with regard to the center of the bump cluster, thereby providing varying degrees of scrub by bumps within the same cluster.

Figure 10:
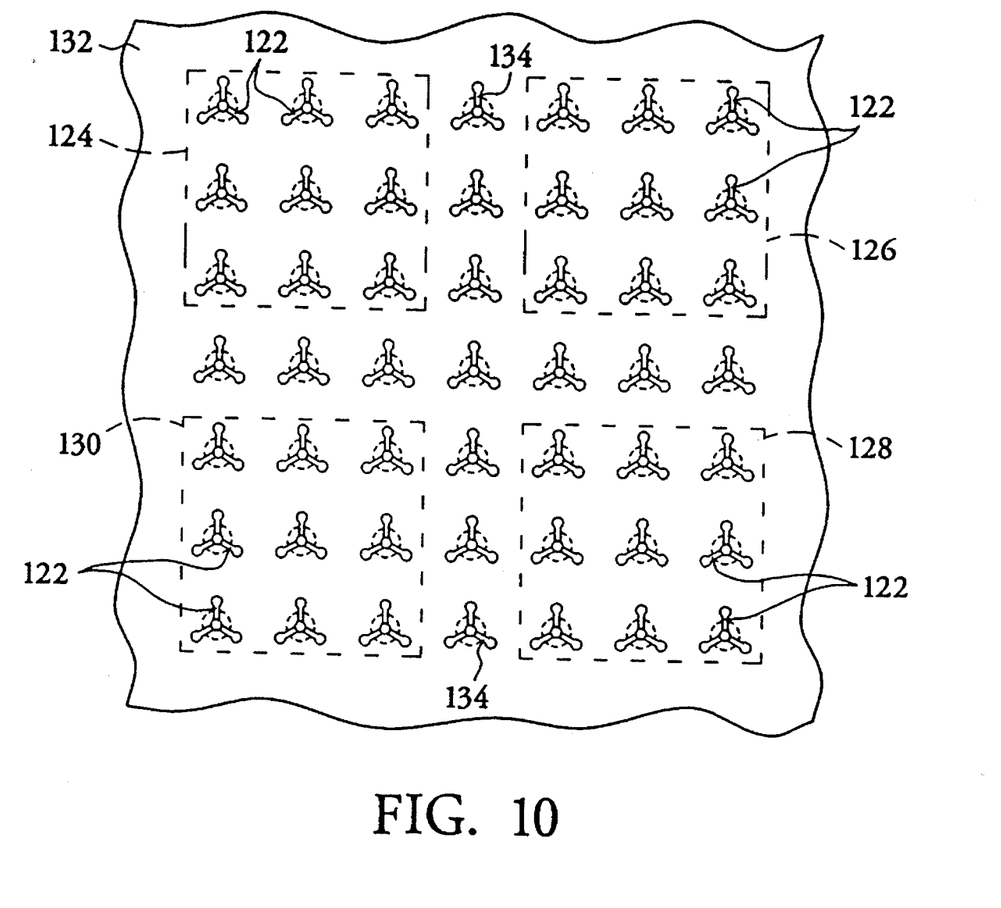
FIG. 10 is a top view of another embodiment of a microconnection device in accordance with the invention.

Referring now to FIG. 10, it is not important that there be a one-to-one correspondence of microconnections to input/output pads or the like. FIG. 10 shows nine microconnection devices 122 for each of four input/output pads 124, 126, 128 and 130. The approach of FIG. 10 relaxes the requirements for properly aligning the pads to a flexible film 132 on which the microconnection devices 122 are formed. Any of the nine microconnections to each pad may be suitable for channeling signals to and from the pad. In addition to the microconnection devices 122 that are aligned with the pads, FIG. 10 includes other microconnection devices 134 on the film 132. These devices 134 fall between the pads, i.e. fall within the streets, but may make contact with pads of other semiconductor chips that are to be tested using the structure of FIG. 10. An important consideration in the fabrication of FIG. 10 is that none of the microconnection devices 122 and 134 be so large as to simultaneously contact two pads.

Figure 11:
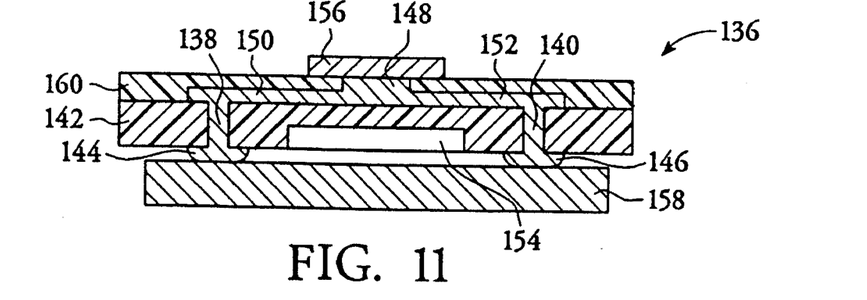
FIGS. 11 and 12 are side sectional views of alternative embodiments of test probes in accordance with the invention.

FIG. 11 shows a microconnection device 136 for use with a test head. Plated through holes 138 and 140 are formed in an insulating elastomer film 142. Metallic microbumps 144 and 146 extend downwardly from the lower surface of the film. A top bump 148 is electrically connected to the plated through holes via traces 150 and 152. A cavity 154 is formed in the central region between the microbumps. The cavity reduces the thickness of the film 142 within the central region, thereby increasing the flexibility of the film within this region.

Figure 12:
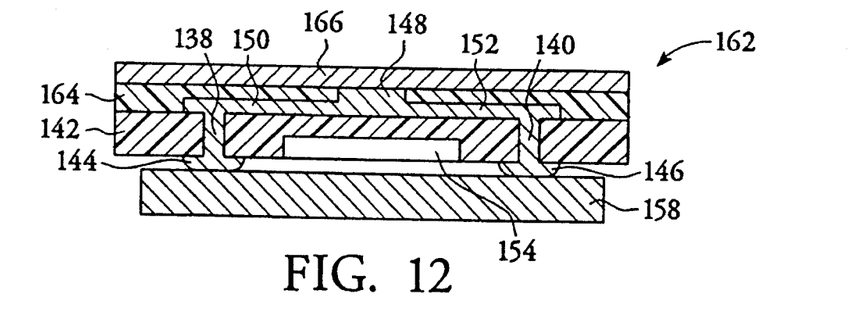

In a circuit test, a compression force is applied from a carrier 156 in the thickness direction of the film 142. The compression force is delivered through the carrier to the half-etched cavity portion 154. Consequently, the microbumps 144 and 146 are pushed radially outwardly. The friction between the microbumps and an input/output pad 158 removes contaminants from the interface between the bump and the pad. For example, aluminum oxide may be removed from the surface of an aluminum pad 158. Proper conductivity is thereby better assured for a precise circuit test. The microconnection device 136 is appropriate for a planar carrier 156 and a rigid adhesive layer 160. This embodiment limits the lateral extent of the carrier 156. An alternative embodiment of a microconnection device 162 is shown in FIG. 12. In this embodiment, a flexible adhesive layer 164 is used in order to allow a rigid planar carrier 166 to extend further in the lateral direction without impeding flexure of the insulating elastomer film 142. Since FIG. 12 is identical to FIG. 11, other than with respect to the adhesive layers and the carriers, there are a number of duplications of reference numerals used in the two figures.

Figure 13:
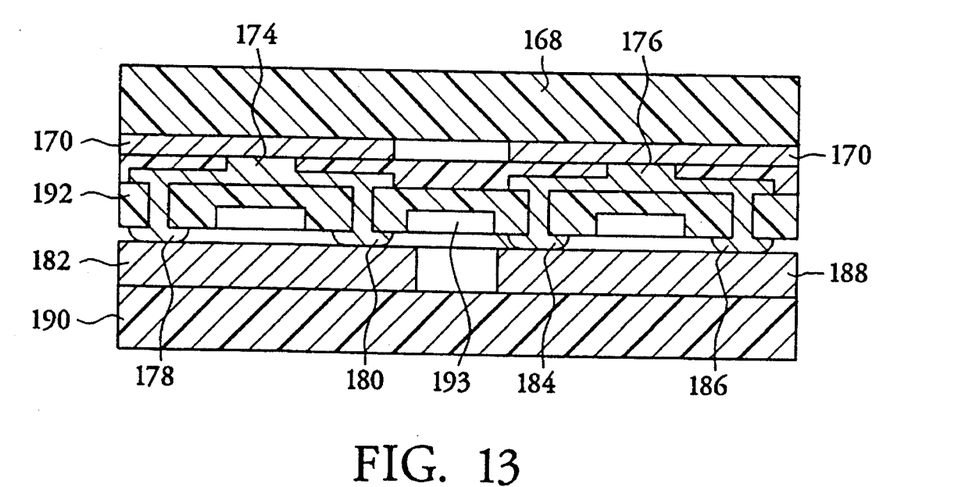
FIG. 13 is a side sectional view of another embodiment of the invention, using multiple bump clusters and a reduced-thickness film between adjacent clusters.

In FIG. 13, a "non-planar" carrier 168 is shown. The carrier is non-planar, since it includes conductive carrier pads 170 and 172 that extend downwardly from a non-conductive substrate. Each carrier pad is in contact with a top bump 174 and 176. When the load force is applied to the top bumps, microbumps 178 and 180 are pressed against a first input/output pad 182 and microbumps 184 and 186 are pressed against a second input/output pad 188. The first and second input/output pads 182 and 188 may be pads of a semiconductor chip or other substrate 190.

The microbumps 178 and 180 are bumps of a first cluster, while the bumps 184 and 186 are bumps of a second cluster. A flexible film 192 may have any number of such clusters. Each cluster has at least two microbumps, but the precise number is not critical.

In the embodiment of FIG. 13, the portion of the flexible film between the two clusters is partially etched to form a cavity 193. The cavity 193 reduces the rigidity of the film within the regions between adjacent clusters.

Figure 14:
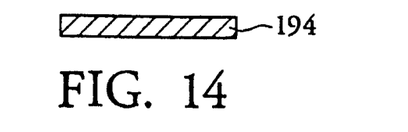
FIGS. 14–20 are side sectional views of process steps for forming a microconnection device in accordance with the invention.
Figure 15:
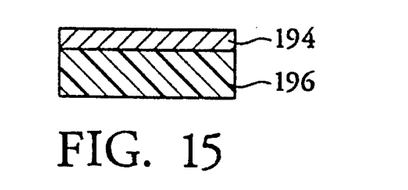

The process for forming a microconnection device is shown in FIGS. 14–20. In FIG. 14, an electrically conducting material 194 is selected for forming a metallic pattern on an insulating elastomer film. The layer 194 may be formed of gold, silver, copper, iron, nickel, cobalt or alloys thereof. Referring to FIG. 15, the layer 194 may be formed on the insulating film 196 by known methods such as sputtering, evaporation, plating or the like.

As previously noted, the insulating film 196 is selected for its properties regarding flexibility and electrical insulation. Acceptable materials include polyester resins, epoxy resins, urethane resins, polystyrene resins, polyethylene resins, polyamide resins, polyimide resins, ABS resins, polycarbonate resins, silicone resins and fluorine resins. The material may be thermosetting or thermoplastic. A polyamide resin is preferred because of its properties with regard to heat resistance, mechanical strength and processing.

Figure 16:
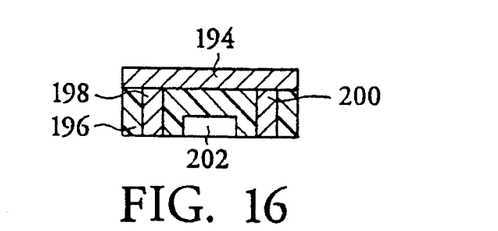

The electrically conductive layer 194 may be deposited onto the insulating film 196 in the desired pattern or may be patterned after deposition onto the insulating film. Photolithographic techniques may be utilized. Referring now to FIG. 16, photolithography may also be used to form through holes 198 and 200 through the insulating film 196 to the back side of the conductive layer 194. Alternatively, the through holes may be formed by laser processing, mechanical processing, chemical etching or the like. In order to achieve a minimal electrical resistance of metallic material through the through hole, the diameter of the through hole is preferably made as large as possible while maintaining a desired pitch. The pitch of the through holes should be as small as possible in order to increase the number of through holes in contact with a given input/output pad or other contact. Nevertheless, adjacent through holes should not be so large as to connect with one another.

Also shown in FIG. 16 is the cavity 202 that reduces the flexibility at the central region between the adjacent through holes 198 and 200. The cavity may be formed by mechanical processing, laser processing, photo processing, chemical etching or the like. The depth of the cavity is one factor in the determination of the flexibility of the microconnection device to be formed. Total compliance of the device depends on other factors as well, e.g. the thickness of the conductive film 194, the remaining thickness of the insulating film 196, and the height of the bumps to be formed on the lower surface of the insulating film. A photosensitive resin and a non-photosensitive resin may be laminated onto the lower surface of the insulating film 196, and a predetermined portion of the photosensitive resin may be removed by photolithography as steps in forming the cavity 202.

The conductive material within the through holes 198 and 200 may be formed using electrolyte plating, thereby applying a metallic material into a tube-like path. In order to achieve desired conductivity, filling the through holes by electrolyte plating is preferred.

Figure 17:
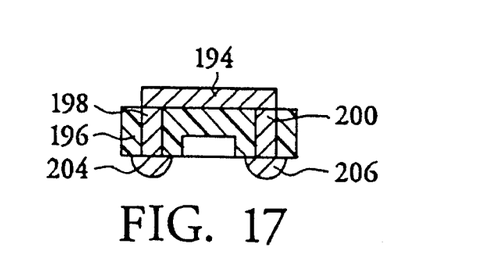

Referring now to FIG. 17, metallic bumps 204 and 206 are then formed at the lower surface of the insulating film 196 in alignment with the through holes 198 and 200. An acceptable range for forming the bumps is 0.1 μm to several hundred μm.

Figure 18:
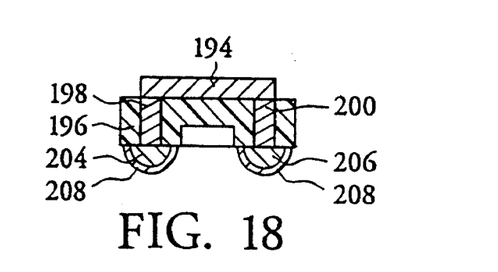

In FIG. 18, an optional layer of conductive material 208 is formed along the exterior of the bumps 204 and 206. The optional layer should be selected for its properties regarding minimizing the contact resistance. For example, an inexpensive metallic material, such as copper, may be used for plating the through holes 198 and 200, a metallic material may be selected for forming the bumps 204 and 206 based upon its barrier characteristics, such as nickel, and the optional layer 208 may be formed to achieve a desired reliable connection, such as gold. The barrier characteristics of the material for the bumps 204 and 206 are important for prohibiting mutual reaction of the metallic layers for forming the plated through holes and the optional layer.

Figure 19:
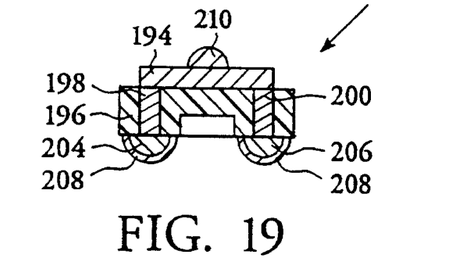
Figure 20:
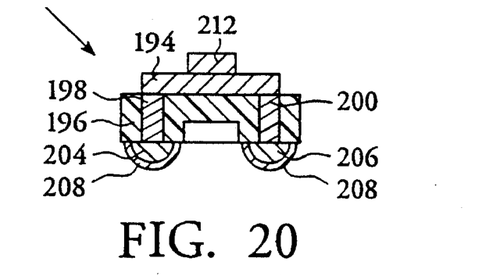

A top bump may then be formed to have a mushroom shape 210, as shown in FIG. 19, or a rectangular shape 212, as shown in FIG. 20.

Regarding dimensions, the conductive layer 194 of FIG. 14 may be in the range of one-eighth to one ounce coating of a copper foil. A photosensitive polyimide precursor solution may be coated onto the foil and dried to form the structure of FIG. 15. The foil and the polyimide film 156 may be exposed to light in such a manner that through holes having a diameter of 50 μm and a pitch of 200 μm are formed. In FIG. 16, the half-etched cavity may be 130 μm$^2$ and may be formed by changing the light exposure, after which it is subjected to a post exposure bake and is developed. A curing process then provides a two-layer base material composed of polyimide and copper foil. The through holes may be protected by means of a resist during selective etching of the copper foil to form a selected trace pattern. The protective resist should then be removed.

In a subsequent step, the copper foil 194 is protected by coating the foil with a plating resist. The base material may then be soaked in a rinsing solution. The base material is washed with water and subjected to a Watts bath using nickel at 65° C. The through holes are filed with nickel applied using electroplating techniques in which the copper foil 194 is used as an electrode. Successive electrolyte plating provides the metallic bumps 204 and 206 of FIG. 17. The bumps may have a height of 30 μm and a maximum diameter of 89 μm. Then, strike plating and platinum plating may be subsequently applied to protect the surface of the bumps. The copper foil surface may be coated by a plating resist and an opening in the resist may be formed by photolithography. A top bump may then be plated either to the height of the plating resist to create the top bump 212 of FIG. 20 or to a height beyond the plating resist to form the hemispherical bump 210 of FIG. 19.

Figure 21:
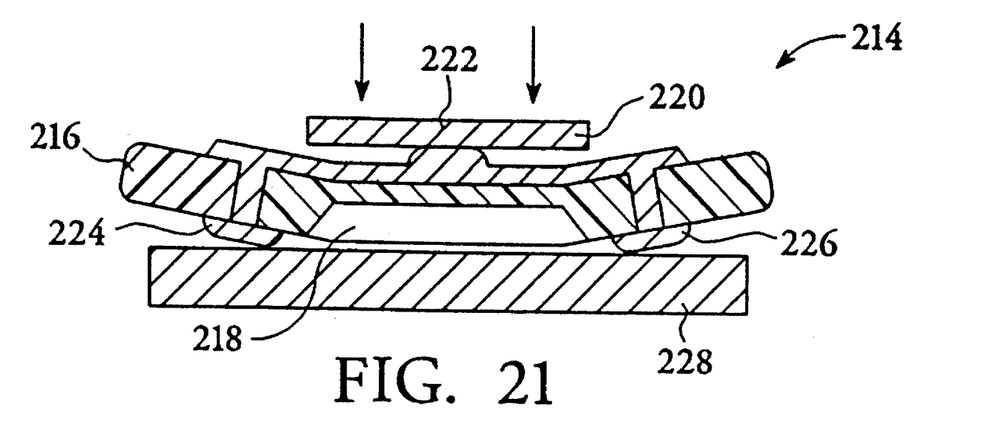
FIG. 21 is a side sectional view of the invention upon application of a load force.

Referring now to FIG. 21, a test head probe may include a microconnection device 214 in which a flexible film 216 includes a cavity 218. Upon the application of a downward force from a carrier trace 220 to a top bump 222, the film is flexed. Microbumps 224 and 226 are caused to move with respect to a contact 228. The movement is both rotational and linear.

Alternatively, the microconnection device 214 is secured in position and it is the contact 228 that receives the force. The results are the same, since an equal and opposite force is applied at the top bump 222 via the carrier trace 220.

Figure 22:
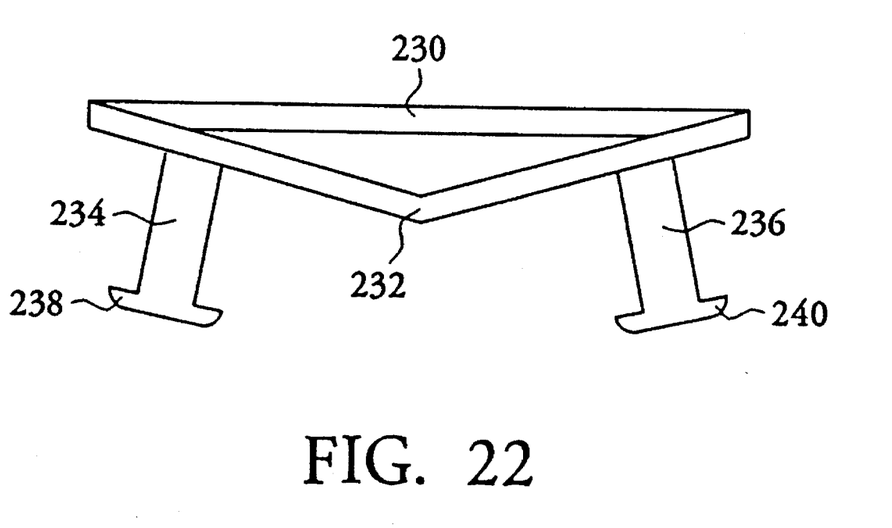
FIG. 22 is a schematical side view of the operation of the device of FIG. 21.

A first benefit of the microconnection device 214 is that there is a degree of load compliance. A second benefit is that movement of the microbumps 224 and 226 along the surface of the contact 228 has the effect of removing contaminants or oxide at the interfaces of the microbumps and the contact. Consequently, false indications of contact failure during a circuit test can be greatly reduced. Referring to FIG. 22, the amount of lateral scrub obtained by flexure of the microconnection device 214 of FIG. 21 is shown schematically. For a microconnection device having a 100 μm "beam" 230, a vertical displacement of 10 μm at a center 232 will provide approximately 8.8 μm of lateral scrub if the total length of each through hole 234 and 236 and microbump 238 and 240 is 50 μm. The resulting lateral scrub consists of two opposing motions: approximately −1 μm from the contraction of the center of rotation of the bump and approximately 9.8 μm from the motion of the end of the bump. The through holes 134 and 136 will come to rest at an angle of 11° to the vertical. However, the amount of vertical scrub may be adjusted in accordance with changes to dimensions of the microconnection device, as will be appreciated by persons skilled in the art.

We claim:

1. A connection device for solder-free connection of a contact to an external circuit upon applying a load force comprising:

an electrically insulative flexible film having opposed first and second surfaces and having through holes that are perpendicular to said first and second surfaces;

an array of electrically interconnected conductors within said through holes, each conductor protruding beyond said first surface to define a bump, said conductors being positioned about a central region within said array; and means aligned with said central region and positioned relative to said second surface for localizing within said central region a load force directed toward said second surface, wherein localizing said load force induces flexure of said flexible film at said central region to increase distances between said bumps of said array.

2. The device of claim 1 wherein said conductors are interconnected by at least one metallic trace formed on said second side of said flexible film.

3. The device of claim 1 wherein said array includes more than two conductors, said conductors being arranged symmetrically about said central region.

4. The device of claim 1 further comprising a plurality of arrays of conductors within through holes in said flexible film, said conductors within an array being electrically interconnected, each array being operatively associated with a means for localizing within a central region of said each array a load force directed toward said second surface of said flexible film.

5. The device of claim 1 wherein said means for localizing includes a bump aligned with said central region of said array.

6. The device of claim 1 further comprising an interconnect pattern to conduct a signal to and from said array, wherein each conductor in said array conducts said signal.

7. The device of claim 1 wherein said flexible film has a reduced dimension within said central region of said array, said reduced dimension being a thickness perpendicular to said first and second surfaces, wherein said reduced thickness increases flexibility of said flexible film within said central region.

8. The device of claim 6 wherein said interconnect pattern is a pattern of leads of a tape automated bonding frame.

9. The device of claim 6 wherein said interconnect pattern is a pattern of traces on a substrate.

10. The device of claim 1 further comprising a pattern of traces on said second surface of said flexible film, including planar traces electrically connecting said conductors, said means for localizing being a top bump protruding beyond said planar traces, said top bump being axially misaligned from said bumps defined at said first surface.

11. A method of forming an anisotropic conductor connection comprising:

forming an array of through holes in an insulative flexible film;

forming electrical paths along and through said flexible film, including forming a cluster of conductors within at least some of said through holes and including forming traces adjacent to a second surface of said flexible film to connect said conductors within said cluster, forming said electrical paths further comprising forming bumps on a first surface of said flexible film opposite to said second surface, said bumps being electrically connected to said conductors within said cluster;

aligning said bumps with a contact of interest; and flexing said flexible film to displace said bumps, thereby providing contact scrubbing and load compliance, flexing said flexible film including applying a load force directed toward said second surface and within a region between said conductors of said cluster.

12. The method of claim 11 further comprising forming a load-receiving raised area on a side of said flexible film opposite to said bumps, applying said load force including directing said load force onto said raised area.

13. The method of claim 12 wherein forming said raised area includes forming a top bump that is axially misaligned with said bumps on said first surface.

14. The method of claim 11 further comprising reducing a thickness of said flexible film within at least a portion of said region between said conductors of said cluster, thereby forming a reduced thickness region to facilitate flexing said flexible film.

15. The method of claim 11 further comprising forming a plurality of clusters of said interconnected conductors.

16. A microconnection device for solder-free connection of a first circuit to an external circuit comprising:

an insulative flexible substrate having a plurality of through holes;

a plurality of clusters of conductors fixed within said through holes, conductors within a cluster being electrically connected by metallic traces;

raised members extending from said conductors on a first surface of said flexible substrate, said raised members of conductors within a cluster being spaced apart and being arranged about a flex region of said flexible substrate; and load transfer members at a side of said flexible substrate opposite to said first surface, said load transfer members being positioned to apply forces concentrated within said flex regions within said clusters, thereby inducing adjacent raised members of each cluster to separate upon flexure of said flex regions.

17. The device of claim 16 wherein said flexible substrate is reduced in thickness along at least a portion of each flex region.

18. The device of claim 16 wherein said load transfer member is a top bump having an axis misaligned with axes of said conductors.

19. The device of claim 16 wherein said raised members are bumps and wherein each cluster has at least two bumps.

* * * * *